(12) United States Patent
Midya et al.

(10) Patent No.: US 6,414,613 B1
(45) Date of Patent: Jul. 2, 2002

(54) APPARATUS FOR NOISE SHAPING A PULSE WIDTH MODULATION (PWM) SIGNAL AND METHOD THEREFOR

(75) Inventors: Pallab Midya, Schaumburg; Matthew R. Miller, Palatine, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/478,013

(22) Filed: Jan. 5, 2000

(51) Int. Cl.[7] .............................................. H03M 3/00
(52) U.S. Cl. ...................................... 341/143; 341/138
(58) Field of Search ................................ 341/143, 144, 341/155, 138

(56) References Cited

U.S. PATENT DOCUMENTS 4,977,403 A * 12/1990 Larson ........................ 341/143
5,708,433 A * 1/1998 Craven ........................ 341/144
5,933,106 A * 8/1999 He et al. ..................... 341/116

OTHER PUBLICATIONS

Adams, "The Design of High–Order Single–Bit $\Delta\Sigma$ ADCs," Delta–Sigma Data Converters, Chapter 5, pp. 165–192.

* cited by examiner

Primary Examiner—Peguy Jeanpierre
(74) Attorney, Agent, or Firm—Joanna G. Chiu; Kathryn Braquet Tsirigotis

(57) ABSTRACT

A method for preserving phase information during quantization of pulse width modulation (PWM) signals used in power system applications. In one embodiment, a digital audio amplifier (12) implements a method of noise shaping, where the quantization error is used in coordination with a noise shaping filter (64) to remove the noise from the desired baseband of the output. A phase-preserving expression is used to provide additional information for generating the amplified output (40). In one embodiment, the filter (64) includes a series of integrators (70, 72), where non-linear integration terms are added at each stage of integration to provide the phase information. In one embodiment the filter is implemented in software to run on a digital signal processor, and in another the filter is implemented in a hardware accelerator.

51 Claims, 6 Drawing Sheets

APPARATUS FOR NOISE SHAPING A PULSE WIDTH MODULATION (PWM) SIGNAL AND METHOD THEREFOR

RELATED APPLICATIONS

This is related to Midya et al., Ser. No. 09/477,985, entitled "Switching Circuit and Method Therefor," and Midya et al., Ser. No. 09/478,024, entitled "Circuitry for Converting a Sampled Digital Signal to a Naturally Sampled Digital Signal and Method Therefor," both filed on even date herewith, and are incorporated herein by reference.

This is also related to U.S. patent application Ser. No. 09/307,453, filed May 7, 1999, and entitled "Method and Apparatus for Producing a Pulse Width Modulated Signal" and is incorporated herein by reference and assigned to the current assignee hereof.

FIELD OF THE INVENTION

This invention relates generally to digital amplifiers, and more specifically to noise shaping of a PWM signal.

RELATED ART

In power delivery system applications it is desirable to provide maximum power to the load, and avoid dissipation of power throughout the system. In applications such as digital audio amplifiers, often pulse width modulation (PWM) is used to transform a digital signal into its analog component. These systems are often referred to as digital PWM audio amplifiers, and are used to reproduce signals stored on a compact disc (CD) in a 16 bit format, or in a higher resolution format of 18 to 20 bits, where information is stored according to pulse code modulation (PCM).

The CD signal is a digital signal, represented by series of ones and zeroes. A PWM signal with quantized duty ratio is generated from the digital signal by periodic switching between a high and low output voltage level. This quantization operation introduces noise, and disturbances to the output signal. It is desirable to limit the switching frequency in order to reduce the total amount of switching necessary.

The analog signal generated by a PWM is typically distortion free. The PWM signal is described by its period, magnitude, and phase. Each cycle of a PWM signal has a corresponding duty ratio. During the digital processing, the PWM duty ratio is quantized, resulting in a reduced signal-to-noise ratio (SNR). The quantized PWM signal introduces audible distortion and raises the noise floor of the audible frequency band. One prior art solution involves noise shaping the PWM signal using classical noise shaping to manipulate the entire signal in hopes to reduce the noise floor and force the noise out of the audible range. One method treats the PWM signal as a PCM signal, however, PWM is a nonlinear process and results in out-of-band noise mapping into the baseband. When using two-sided PWM, the right and left halves are noise shaped individually, resulting in half the over-sampling ratio.

During noise shaping the phase information of the signal is typically lost. Most prior art solutions seek to compensate for the phase loss without actually preserving the phase information. One such solution involves complicated filters which then requires sharp filter again at the output. Another solution characterizes the input data using a lookup table approach of stored information. This latter approach introduces greater memory requirements and inaccuracies introduced by the prediction methods.

There is a need for an accurate method of noise shaping which does not introduce the added memory requirements of prior art methods, and which preserves the phase information throughout the process.

BRIEF DESCRIPTION OF THE FIGURES

The present invention is illustrated by way of example and not limited to the accompanying figures in which like references indicate similar elements.

Skilled artisans appreciate that elements in the figures are illustrated for simplicity and clarity and have not necessarily been drawn to scale.

DETAILED DESCRIPTION

In one aspect of the present invention, a method for converting a digital signal to a lower resolution digital signal includes receiving the digital signal, and computing the lower resolution digital signal by noise shaping using at least one phase-preserving term. In one embodiment, the phase-preserving term is a non-linear term.

According to another aspect of the present invention, circuitry for converting a digital signal to a lower resolution digital signal includes a noise shaping quantizer, said noise shaping quantizer having a first input to receive the digital signal, having an output to provide the lower resolution digital signal, and having a second input to receive a non-linear term.

Figure 1:
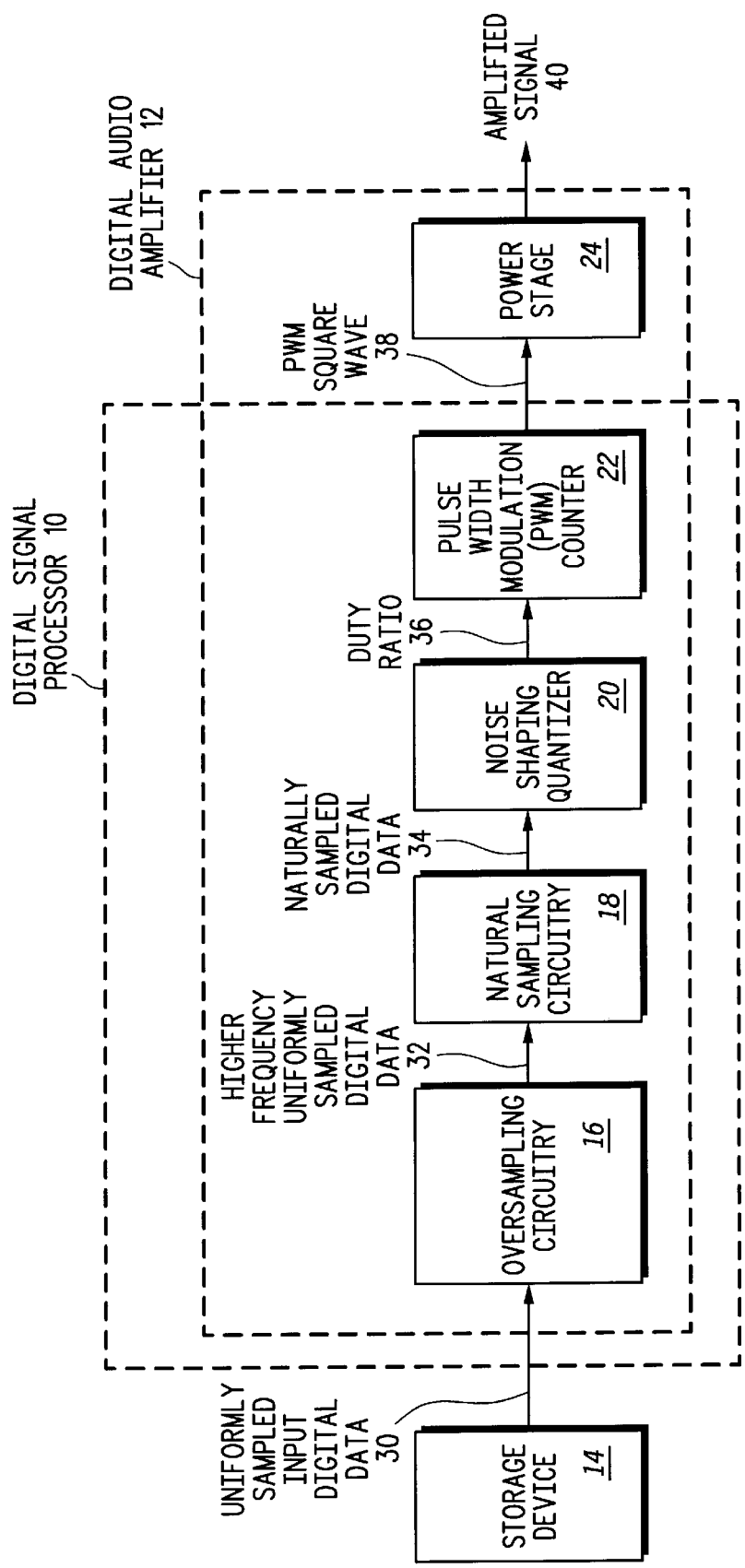
FIG. 1 illustrates a digital signal processor and a digital audio amplifier.

FIG. 1 illustrates digital signal processor 10 and digital audio amplifier 12 in accordance with one embodiment of the present invention. Digital signal processor (DSP) 10 includes oversampling circuitry 16, natural sampling circuitry 18, noise shaping quantizer 20, and pulse-width modulation (PWM) counter 22. Digital audio amplifier 12 includes oversampling circuitry 16, natural sampling circuitry 18, noise shaping quantizer 20, pulse-width modulation counter 22, and power stage 24. Storage device 14 provides uniformly sampled input digital data 30 to oversampling circuitry 16. Oversampling circuit 16 provides higher frequency uniformly sampled digital data 32, to natural sampling circuitry 18. Natural sampling circuitry 18 provides naturally sampled digital data 34, to noise shaping quantizer 20, which in turn provides a duty ratio 36 to PWM counter 22. PWM counter 22 provides a PWM square wave 38 to power stage 24, which in turn outputs amplified signal 40.

In operation, storage device 14 contains a uniformly sampled input digital 30. Storage device 14 can include such devices as a CD or digital audio tape. Storage device 14 may also be used to broadcast digital data to a receiver for inputting into DSP 10. This uniformly sampled input digital data 30 includes a stream of values which may include a audio signal. For example, CD data has a 16-bit resolution signal sampled at a 44.1 kilohertz frequency. This uniformly sampled input digital data 30 is then converted to a higher frequency uniformly sampled digital data 32 by oversampling circuitry 16. Effectively, oversampling circuitry 16 is a data rate converter where data comes in at one rate and is output at a different rate. In one embodiment of the present invention, oversampling circuitry 16 receives uniformly sampled input digital data 30 and samples it at a rate 8 times greater to produce the higher frequency uniformly sampled digital data 32. For example, in the case of the CD where uniformly sampled input digital data 30 is sampled at a rate of 44.1 kilohertz, oversampling circuitry 16 would sample this signal at a higher frequency of 352.8 kilohertz to produce the higher frequency uniformly sampled digital data 32. Natural sampling circuitry 18 then converts the uniformly sampled digital data signal 32 into a naturally sampled digital data signal 34. Operation of natural sampling circuitry 18 will be discussed below in reference to FIG. 2.

Noise shaping quantizer 20, quantizes the naturally sampled digital data signal 34 in order to produce a lower resolution signal such that the noise in the frequency band of interest is limited. Therefore, noise shaping quantizer 20 converts naturally sampled digital data 34 into duty ratio 36. This duty ratio 36 is then used by PWM counter 22 to produce PWM square wave 38. The PWM square wave 38 at the output of PWM counter 22 is amplified by power stage 24 to produce amplified signal 40 at the output of digital audio amplifier 12.

Note that FIG. 1 illustrates the use of uniformly sampled input digital is data signals. However, other embodiments of the present invention may use sampled digital signals that are not uniformly sampled. For example, the frequency may vary over the range of the input digital data. Also, while FIG. 1 illustrates a digital audio amplifier, other embodiments may use other types of digital amplifiers, depending on the application, and are not limited to digital audio amplifiers.

Figure 2:
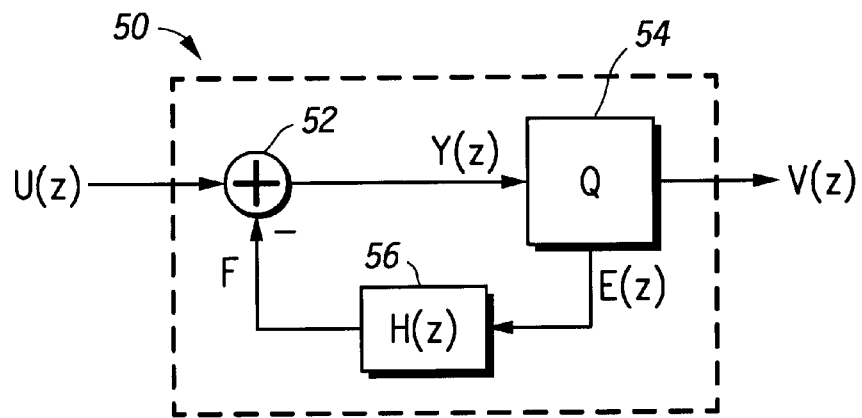
FIG. 2 illustrates a noise shaping quantizer, as illustrated in FIG. 1, according to a prior art system.

FIG. 2 illustrates a prior art noise shaping quantizer 50 which may be used in place of noise shaping quantizer 20 of FIG. 1. The noise shaping quantizer 50 of FIG. 2 receives an input that is a naturally sampled digital data signal, and processes that signal through a loop including a feedback summer 52, a quantizer (Q) 54, and a finite impulse response (FIR) filter 56. The input is a high resolution signal, such as that generated by a CD or DVD, while the output is a low resolution signal to be processed by a digital to analog converter (DAC), which is typically lower bit resolution. The noise-shaping quantizer 50 is described in the digital domain, or z domain. The FIR filter 56 is has a transfer function of H(z). The input data is given in the form of U(z), while the output of feedback summer 52 is given in the form of Y(z). The transfer function of the noise shaping quantizer 50 is given as:

$$V(z)=U(z)+(1=(H(z)))*E(z) \qquad \text{Equ. 1}$$

An error term identified as E(z) is provided from quantizer 54 to FIR filter 56. The error term is the z transform of the quantization error. Typically a noise shaping quantizer, such as quantizer 54 of FIG. 2, will have multiple inputs and multiple outputs, where a portion of the outputs become the error term.

The order of FIR filter 56 is determined by the number of delay taps implemented within the filter. In a first order low pass case, $H(z)=Z^{-1}$ and the quantization error is simply high pass filtered with zero as the DC value. The output of the noise shaping quantizer 50 in this case is then the input to the loop plus an error term, where the error term is the high pass filtered quantization noise.

Typically, the input U(z) is in the form of a sequence of numbers corresponding to the PCM representation of an analog signal. PCM is typically used in compact disc (CD), and is also used in digital video disc (DVD) and other digital communication technologies. The noise shaping quantizer 50 of FIG. 2 is referred to as an error feedback topology, where the quantized error is provided to a noise shaping filter and the filtered result (at F) is summed with the input. While this type of quantizer works well with PCM applications, distortion and a loss of phase information result from delays introduced by the FIR filter 56. Most common PWM digital audio amplifiers also use a quantizer such as noise shaping quantizer 50 of FIG. 2.

The noise shaping quantizer 50 of FIG. 2 is also applicable to PWM representations of analog signals. In the PWM case, the input is a sequence of numbers representing each duty ratio of each cycle of the PWM signal. Due to the non-linear nature of PWM, however, the resulting output, a sequence of quantized duty ratios, produces distortion terms and raises the noise floor when converted back to an analog signal. In power distribution applications, it is important to reduce this distortion at the analog output.

Figure 3:
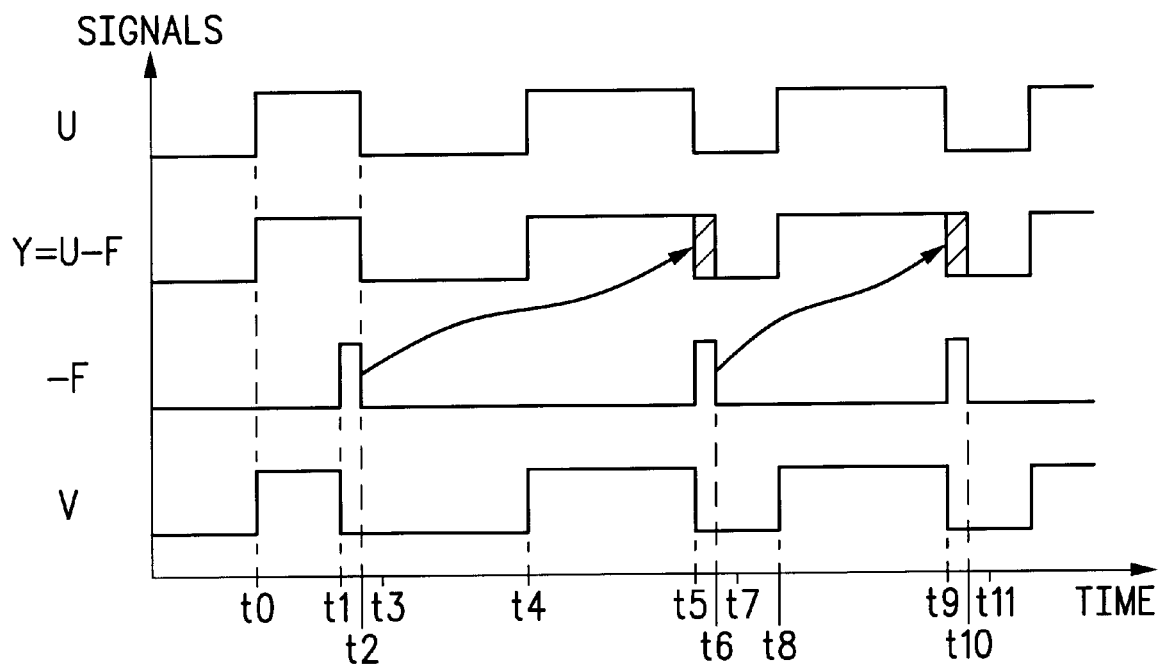
FIG. 3 illustrates the signals corresponding to the noise shaping quantizer according to a prior art system.

FIG. 3 illustrates a timing scenario associated with the prior art noise shaping quantizer 50 of FIG. 2. The vertical axis represents the various signals found within noise shaping quantizer 50, while time is represented on the horizontal axis. V corresponds to the output, U corresponds to the input, F corresponds to the filtered quantization of the error term E, and Y corresponds to the difference, (U−F). One quantization period runs from t0 to t4 and has a period Ts. As the quantization process seeks to control the width of the generated PWM pulse, each period Ts has predetermined times for valid pulse widths. When a signal transition does not occur at a valid time, referred to as a valid quantization level, the signal is corrected to transition at a valid level. The quantization scheme may correct the signal transition back to the previous valid level or may move the transition forward to the next valid level.

The timing scenario of FIG. 3 illustrates three full quantization periods. Within each quantization period, the PWM pulse and the error pulse are indicated. The first quantization period starts at time t0 and is defined by the rising edge of the output, V. The error pulse, F, begins at time t1 and ends at time t2. In this quantization cycle, time t2 also corresponds to the falling edge of the input, U. The times t1 and t3 are successive valid quantization levels, and time t2 falls in between them. According to the illustrated quantization processing, correction of the output signal, Y, moves it back to time t1, the closest previous valid quantization level. This correction is in response to the filter quantization error, F, of the previous cycle (not shown). The filter quantization error, F, occurring during this quantization period will be used in the next quantization period starting at time t4 and ending at time t8. The filtered quantization error, F, is used to adjust the input to provide a corrected output, Y. During this quantization period, while the falling edge of the output, V, occurs at time t5, the falling edge of Y occurs at time t6. The falling edge of the signal Y was extended based on the filtered quantization error, F, from the previous quantization period. For this quantization period, the falling edge of Y occurs at time t6 which is between valid quantization levels t5 and t7. The signal Y is therefore quantized to the last occurring quantization level at time t5. As illustrated in FIGS. 2 and 3, the filtered quantization error, F, provides necessary feedback and is available for correction of successive iterations.

Figure 4:
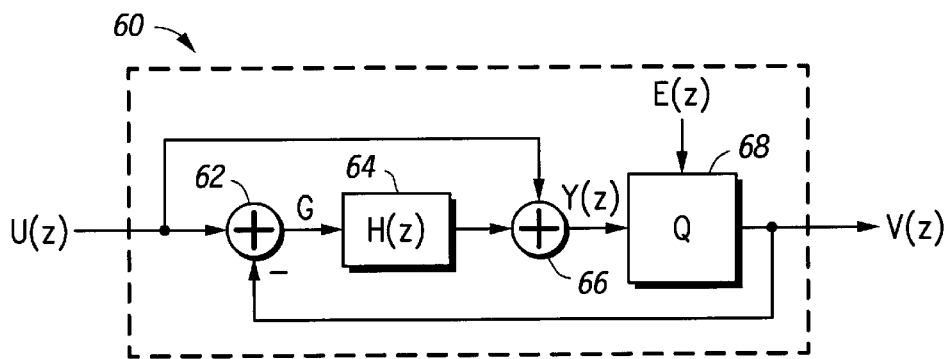
FIG. 4 illustrates a noise shaping quantizer, as in FIG. 1, according to one embodiment of the present invention.

FIG. 4 illustrates a noise shaping quantizer 60 according to one embodiment of the present invention, where input data U(z) is provided to feedback summer 62. The noise shaping quantizer 60 also includes a noise shaping filter 64, an adder 66 and a quantizer 68. The input data U(z) is input to feedback summer 62. The feedback summer 62 determines the difference between the input U(z) and the output V(z), providing the difference to noise shaping filter 64. The transfer function of the noise shaping filter 64 is given as H(z). The filtered response of filter 64 is provided to adder 66. Noise shaping filter 64 is made up of multiple integrators, where a weight is assigned to the output of each integrator, and a sum formed of multiple weighted outputs. Many examples of noise shaping filters having a variety of transfer functions and configurations are found in the prior art. The number of integrators, the configuration and the weight assignments are determined according to the requirements of the system.

The adder 66 sums the filtered response from filter 64 with the original input signal U(z), outputting the sum as Y(z) to quantizer 68. Quantizer 68 adds quantization noise to Y(z). The quantization noise is given as E(z). While noise shaping quantizer 60 is similar to a sigma-delta loop, noise shaping quantizer 60 has an additional summing node where the input U(z) is summed with the output of the noise shaping filter 64.

Considering a first order case where the transfer function of noise shaping filter 64 is given as:

$$H(z) = z^{-1}/(1-z^{-1})$$ Equ. 2 and the transfer function and performance of noise shaping quantizer 60 are similar to the noise shaping quantizer 50 of FIG. 2. The noise shaping quantizer 60 has been designed to have the same transfer function as noise shaping filter 50 of FIG. 2, where the differences are in the feedback loop configuration and in the characteristics of the noise shaping filter 64. While noise shaping quantizer 60 is structurally different from noise shaping quantizer 50, they are functionally the same.

To improve the performance of noise shaping quantizer 60, additional feedback terms are provided to the noise shaping filter 64. These additional terms contain phase information that is lost in PWM noise shaping quantizers. Feedback summer 62 calculates the difference between the input U(z) and the output V(z), indicated by the negative V(z) input. The filter 64 integrates this difference expression. The high order integrations of the difference expression preserve the phase information. While providing the phase information, the addition of these terms result in a higher degree of difficulty in analyzing the stability of noise shaping quantizer 60.

As discussed above, the first order case yields the same result as noise shaping quantizer 50, however, higher order cases provide improved results. The second order case is illustrated by way of the noise shaping filter 64 detailed in FIG. 5. In one embodiment, noise shaping filter 64 includes two integrators, 70 and 72. Integrator 70 includes a delay element 78, identified as $z^{-1}$, in series with an adder 74. The output of the delay element 78 is the output of the integrator 70 and has an associated weight, $k_1$, applied at block 75. The weighted output of integrator 70 is then provided to summer 76. The unweighted output of integrator 76 is provided as input to integrator 72, and as feedback to adder 74. Integrator 72 includes a delay element, $z^{-1}$ in series with an adder 78. The adder 78 receives the output of the delay element 79 of integrator 72, the output of the delay element 78 of integrator 70, and an additional input. This additional input is an approximation of continuous time integration of the error term, E(z). The error term E(z) is defined as the difference between the output and the input to noise shaping quantizer 60 of FIG. 4. This term is a non-linear term. The output of integrator 72 has an associated weight, $k_2$, applied at block 77, and the weighted output of integrator 72 is also provided to summer 76, which provides the resultant sum to adder 66 (FIG. 4).

Figure 5:
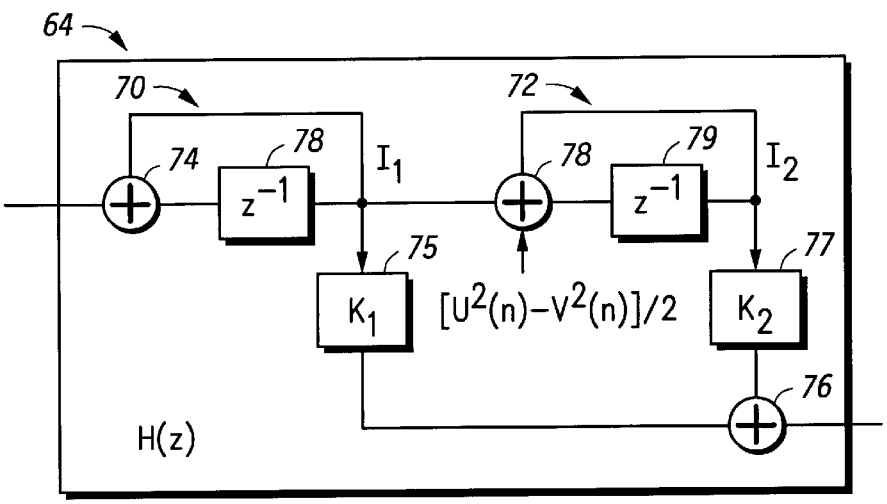
FIG. 5 illustrates a second order noise shaping filter as illustrated in FIG. 4 according to one embodiment of the present invention.

In one embodiment, the noise shaping quantizer 64 of FIG. 5 has gains defined as $k_1=2$ and $k_2=1$. In the second order case the non-linear approximation term is defined as:

$$[U^2(z)-V^2(z)]/2$$ Equ. 3

The transfer function for the noise shaping quantizer 64 is given according to the following relationship:

$$V(z) = U(z) + \frac{E(z)(1-z^{-1})}{1+(k_1-2)z^{-1}+(k_2+k_1+1)z^{-2}} + \left(\frac{k_2}{2}\right)\frac{z^{-1}(1-z^{-1})[U^2(z)-V^2(z)]}{1+(k_1-2)z^{-1}+((k_2+k_1+1)z^{-2}}$$ Equ. 4

Figure 6:
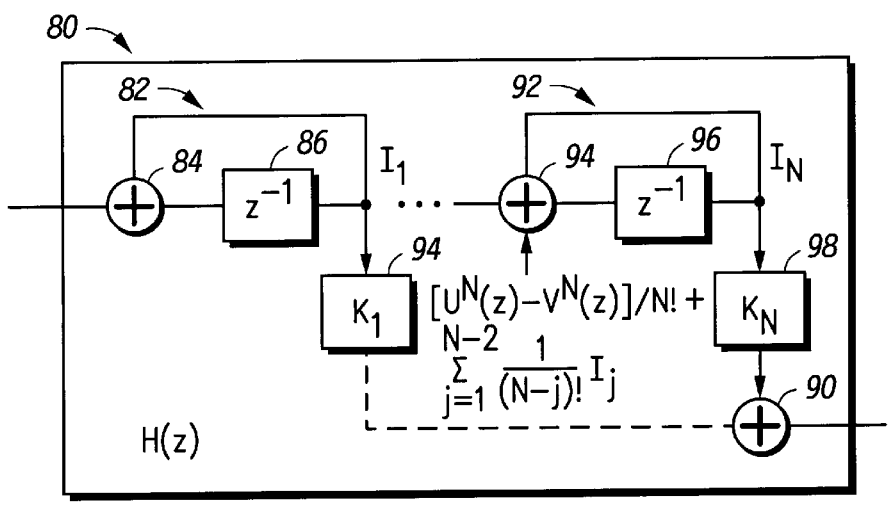
FIG. 6 illustrates a noise shaping filter of a higher order according to one embodiment of the present invention.

FIG. 6 illustrates one embodiment of noise shaping filter 80. This is an extension of the noise shaping filter 64 illustrated in FIG. 5. Here a plurality of integrators are cascaded together to form noise shaping filter 80. A first integrator 82 includes an adder 84 coupled to a delay element 86. The output of integrator 82 is provided as an input to adder 84. A first weight, $k_1$, is applied to the output of integrator 82 at block 88, and the weighted output then provided to adder 90. Adder 90 sums the weighted outputs of each of the integrators within noise shaping filter 80. Multiple integrators are coupled together in tandem form with the final integrator 92 having an adder 94 and a delay element 96. The output of integrator 92 is provided as input to adder 94. A gain $k_n$ is applied to the output of integrator 92 at block 98, and the weighted output then provided to adder 90.

In general, the order limit of a noise shaping filter is determined by stability analysis such as in sigma-delta analysis. One solution assigns an order to the noise shaping filter defined as one less than the number of bits of quantization possible. This is a conservative stability criteria. PWM typically uses a 7 or 8 bit quantizer. In many such applications the bit length of the quantizer is determined by the counter that will be used to generate the output. In PWM applications, traditionally performance increases with the order of the modulator, up to the third order filter. From the fourth order on performance appears to degrade. The present invention provides a method of overcoming this fourth order filter barrier by providing improved performance at orders greater than third order. The present invention increases the in-band SNR.

Referring again to FIG. 1, the output of natural sampling circuitry 18 may be the result of single-sided or double sided-sampling. In double-sided sampling, both the rising and falling edges of the PWM signal are estimated. Double-siding provides additional information and therefore increases the accuracy of the PWM output. In an analog signal, double-sided sampling ideally provides twice the information. Double-sided sampling is typically used when there is an increase in errors and thus an increased need to eliminate noise from a signal. The additional information provided by double-sided sampling increases the SNR, which in some cases doubles. For a given switching frequency, double-sided sampling provides twice the number of samples. Traditional application of the double-sided sampling to digital signals fails to provide the advantages seen in analog sampling.

Figure 7:
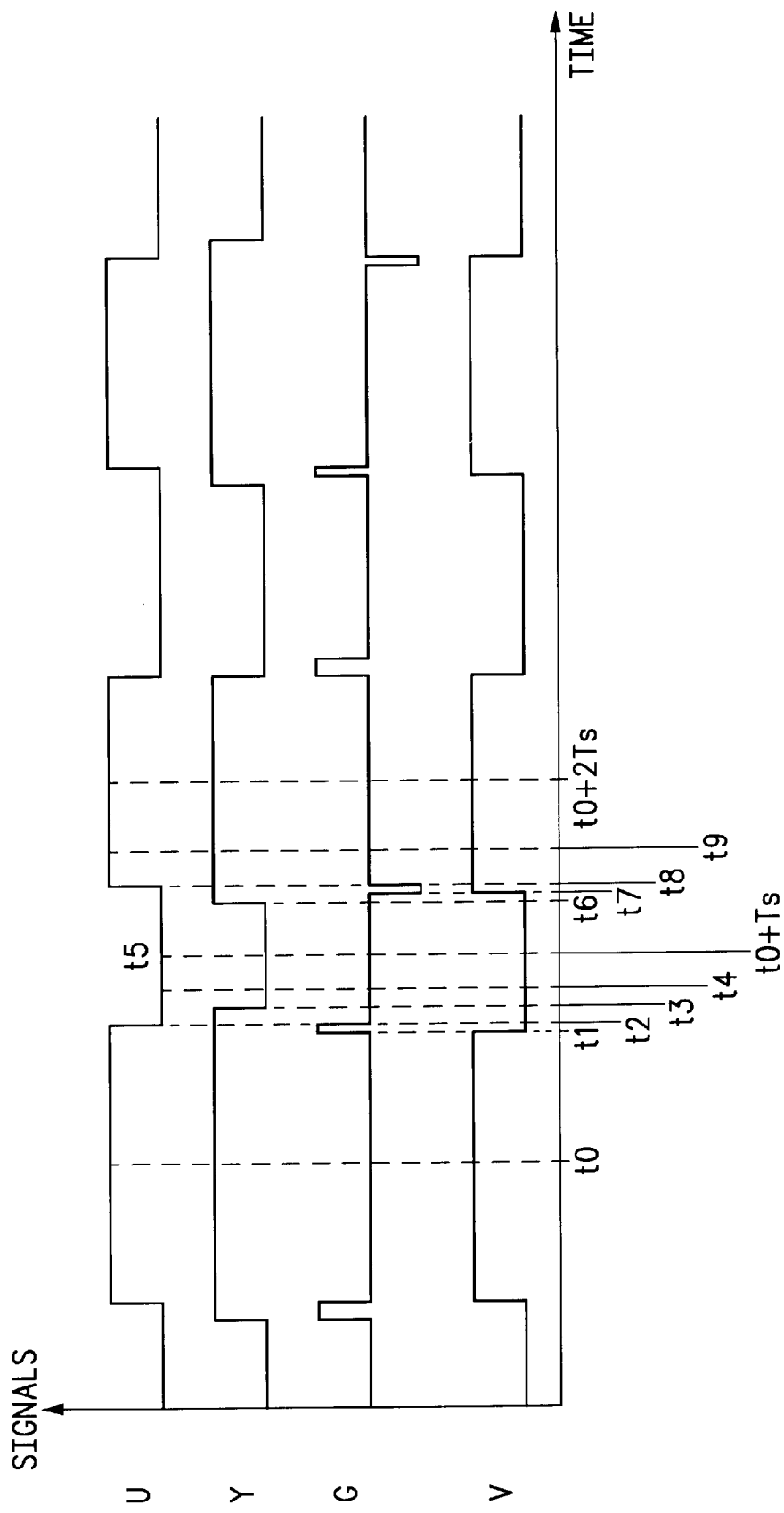
FIG. 7 illustrates, in timing diagram form, various signals associated with noise shaping according to one embodiment of the present invention.

FIG. 7 illustrates a timing scenario associated with double-sided sampling using a noise shaping quantizer such as quantizer 64 of FIG. 5. Unlike single-sided sampling, double-sided sampling provides no fixed transition point, i.e. rising edge of the PWM output. In the single-sided sampling timing scenario of FIG. 3, the quantization period is measured from the rising edge of the PWM pulse. The quantization period then runs until the next rising edge of the PWM signal.

In contrast, double-sided sampling has a predefined starting point that is not determined by the rising or falling edge of the input signal. For double-sided sampling, both the rising and falling edges are corrected to valid quantization levels. In the example illustrated, the vertical axis represents various signals within noise shaping filter 64, while the horizontal axis represents time. The signal U corresponds to the input signal, and V corresponds to the output signal. A signal, G, occurs at the output of adder 62, where G is equal to the difference (U−V). The output, Y, of adder 66 is defined as Y=U+H*G.

Time t0 is the start of a quantization period, having a cyclical period Ts. Therefore, one quantization period is from time to t0 (t0+Ts). Within this quantization period, valid quantization levels are at t1, t4, t7 and t9. Note that the beginning of the quantization period does not correspond to the rising or falling edge of a signal, but rather occurs while the input signal, U, has a high pulse.

As illustrated in FIG. 4, the output signal, V, is fed back prior to the noise shaping filter 64, and provides feedback information to adjust the output, V, at a later time. Timing scenario of FIG. 7 considers the effects of the noise shaping filter 80 of FIG. 6. The falling edge of the output, V, occurs at time t1, which is a valid quantization level. The output V is a result of previous noise shaping of prior quantization periods. During this quantization period, the input signal, U, transitions from high to low, i.e. falling edge occurs, at time t2. The signal, U, then remains low until time t8. The duty cycle of the signal, U, is measured within this quantization period. The falling edges of U and V during his quantization period result in a signal G positive pulse from time t1 to t2, as the signal G represents the difference of U and V. During this quantization period, the signals U, V, and G do not directly effect the signal Y, but rather their effect is seen in subsequent quantization periods. The high pulse of signal Y is extended from time t2 to t3. Again, this extension is not based on the value of G for the current quantization period, rather is based at least in part on the value of G from the previous quantization period.

The next quantization period begins at time (t0+Ts), and the rising edges of signals are significant. This highlights a difference between single-sided and double-sided sampling, as single-sided only considers one type of transition. In this next quantization period, the rising edge of the signal V occurs at time t7, while the rising edge of U occurs at time t8. This results in a negative G, pulse between times t7 and t8.

At this point, the effects of the previous quantization period are seen in the signal Y, where the rising edge of Y occurs at time t6 ahead of the rising edge of U at time t8.

Similarly, the rising edge of output V occurs at time t7, extending the length of the output pulse. This extension is due to the G pulse that occurred between time t1 and time t4. The negative G pulse occurring at time t7 and t8 affects the next edge of Y, which is a falling edge. This is in contrast to the timing scenario illustrated in FIG. 3 where previous error terms affect the next successive falling edge of the signal Y. Here each error term, G, has an effect on the next successive transition of Y, be that a rising edge or a falling edge.

Figure 8:
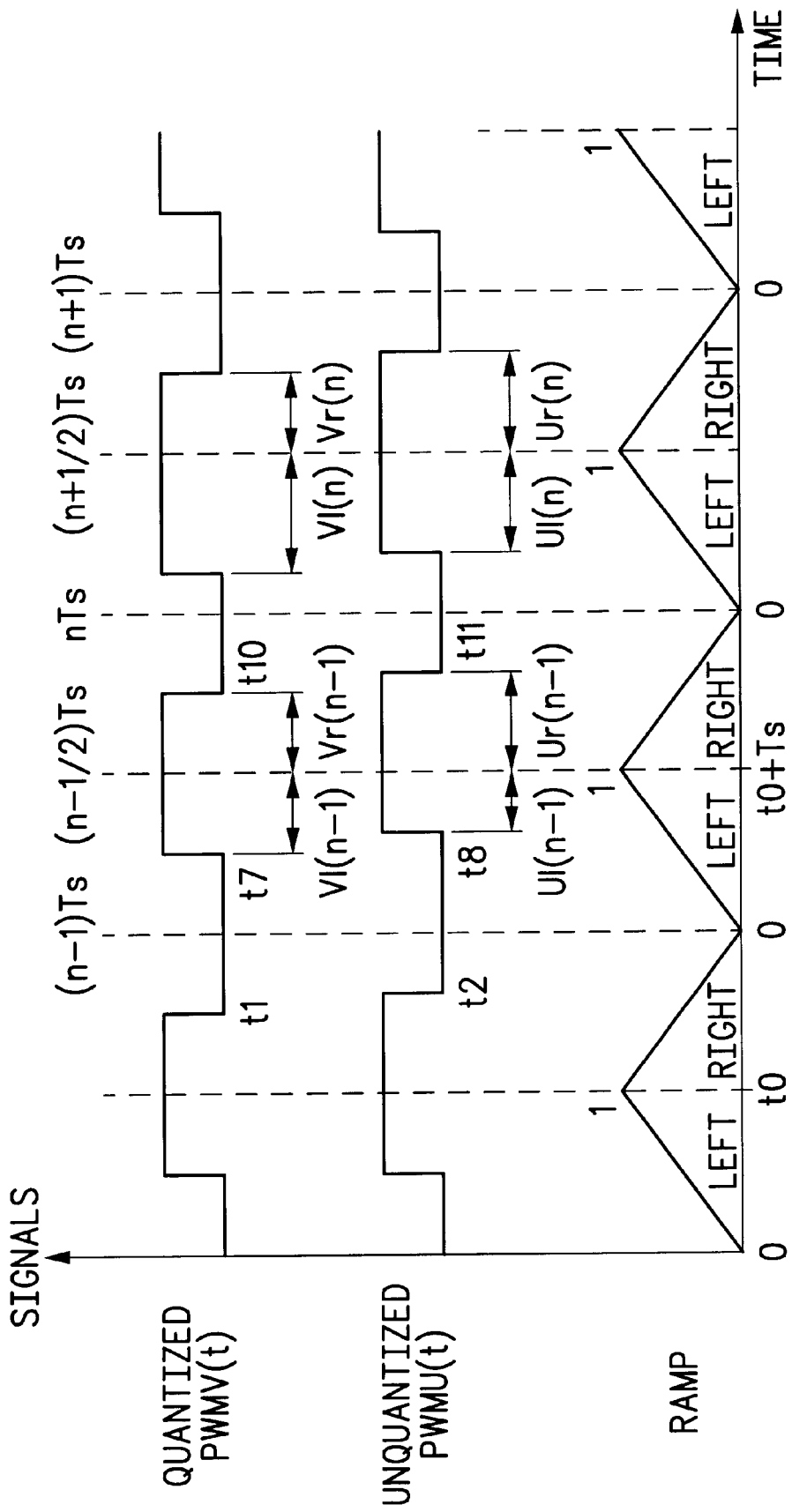
FIG. 8 illustrates, in timing diagram form, various signals associated with noise shaping as in the noise shaping filter of FIG. 4.

The signals U and V illustrated in FIG. 7, are further illustrated in FIG. 8 with reference to a double-sided ramp sampling signal used within natural sampling circuitry 18 of FIG. 1. The vertical axis represents the various signals, while the horizontal axis represents time. The falling edge of the signal V occurs at time t1 while the falling edge of the signal U occurs at time t2. The time t0 is positioned at the slope transition of the ramp signal. One sampling period, corresponding to the quantization period of FIG. 7, is defined as (t0+Ts). Each ramp is broken into a left side and right side as indicated. The values of the ramp signal vary between 0 and 1. The signal V rises at time t7 while the signal U rises at time t8 later than time t7. The length of signal V between time t7 and time t0+Ts is defined as the left width of the pulse. The right width of the pulse is defined as from time (t0+Ts) to time t10, where the falling edge of the signal V occurs. The falling edge of the signal U then occurs at time t11. Placement of the output signal Y is governed by a series of equations provided herein below. The left and right sides of the quantized output signal are represented as vl(n) and vr(n), respectively.

$$vl(n) = \text{Quantize}(yl(n)) \qquad \text{Equ. 5}$$

$$vr(n) = \text{Quantize}(yr(n)) \qquad \text{Equ. 6}$$

where yl(n) and yr(n) are given as:

$$yl(n) = ul(n) + k_1 I_1(nTs) + k_2 I_2(nTs) + k_3 I_3((nTs) + k_4 I_4(nTs) \qquad \text{Equ. 7}$$

$$yr(n) = ur(n) + + k_1 I_1((n+1/2)Ts) + k_2 I_2((n+1/2)Ts) + k_3 I_3((n+1/2)Ts) + k_4 I_4((n+1/2)Ts) \qquad \text{Equ. 8}$$

where the k values correspond to the weighting factors of the multiple integrators of noise shaping filter 80. Further the variables $I_1$, $I_2$, $I_3$, and $I_4$ are defined by the following series of equations.

$$I_1\left(\left(n + \frac{1}{2}\right)Ts\right) = I_1(nTs) + \left(ul(n) - vl(n) - \gamma_1 I_2\left(\left(n + \frac{1}{2}\right)Ts\right)\right) \qquad \text{Equ. 9}$$

$$I_2\left(\left(n + \frac{1}{2}\right)Ts\right) = I_2(nTs) + I_1(nTs) + \frac{((ul(n))^2 - (vl(n)^2)}{2} \qquad \text{Equ. 10}$$

$$I_3\left(\left(n + \frac{1}{2}\right)TS\right) = I_3(nTs) + I_2(nTs) + \frac{I_1(nTs)}{2} + \frac{(ul(n))^3 - (vl(n))^3}{6} - \gamma_2 I_4\left(\left(n + \frac{1}{2}\right)Ts\right) \qquad \text{Equ. 11}$$

$$I_4\left(\left(n + \frac{1}{2}\right)Ts\right) = I_4(nTs) + I_3(nTs) + \frac{I_2(nTs)}{2} + \frac{I_1(nTs)}{6} + \frac{((ul(n))^4 - (vl(n))^4)}{24} \qquad \text{Equ. 12}$$

$$I_1(nTs) = I_1\left(\left(n - \frac{1}{2}\right)Ts\right) + ((1 - vr(n-1)) - (1 - ur(n-1))) - \gamma_1 I_2(nTs) \qquad \text{Equ. 13}$$

-continued $$I_2(nTs) = I_2\left(\left(n - \frac{1}{2}\right)Ts\right) + I_1\left(\left(n - \frac{1}{2}\right)Ts\right) + \frac{((1 - vr(n-1))^2 - (1 - ur(n-1))^2)}{2}$$ Equ. 14

$$I_3(nTs) = I_3\left(\left(n - \frac{1}{2}\right)Ts\right) + I_2\left(\left(n - \frac{1}{2}\right)Ts\right) + \frac{I_1\left(\left(n - \frac{1}{2}\right)Ts\right)}{2} + \frac{((1 - vr(n-1))^3 - (1 - ur(n-1))^3)}{6} - \gamma_2 I_4(nTs)$$ Equ. 15

$$I_4(nTS) = I_4\left(\left(n - \frac{1}{2}\right)Ts\right) + I_3\left(\left(n - \frac{1}{2}\right)Ts\right) + \frac{I_2\left(\left(n - \frac{1}{2}\right)Ts\right)}{2} + \frac{I_1\left(\left(n - \frac{1}{2}\right)Ts\right)}{6} + \frac{((1 - vr(n-1)^4 - (1 - ur(n-1))^4)}{24}$$ Equ. 16

Equations 9–12 compute the first through fourth order integrals of the error due to quantization for the left half of the PWM signal. For clarity of presentation, the order of the integrals is from first to fourth. In practice, the fourth integral is computed, then the third, then the second, and finally the first integral. Equations 13–16 compute the first through fourth integrals of the quantization error for the right half of the PWM signal. These integral equations, in closed form, allow the computation to be performed at the switching frequency.

If it is desired to minimize quantization noise at low frequencies, the fourth integral is strictly the sum of the third integral and so on. In that case the gamma coefficients are set to zero. In the most general case the gamma coefficients are not zero and their values determine frequencies at which the quantization noise is minimized. Appropriate choice of gamma values can optimize the SNR in a band of interest.

Figure 9:
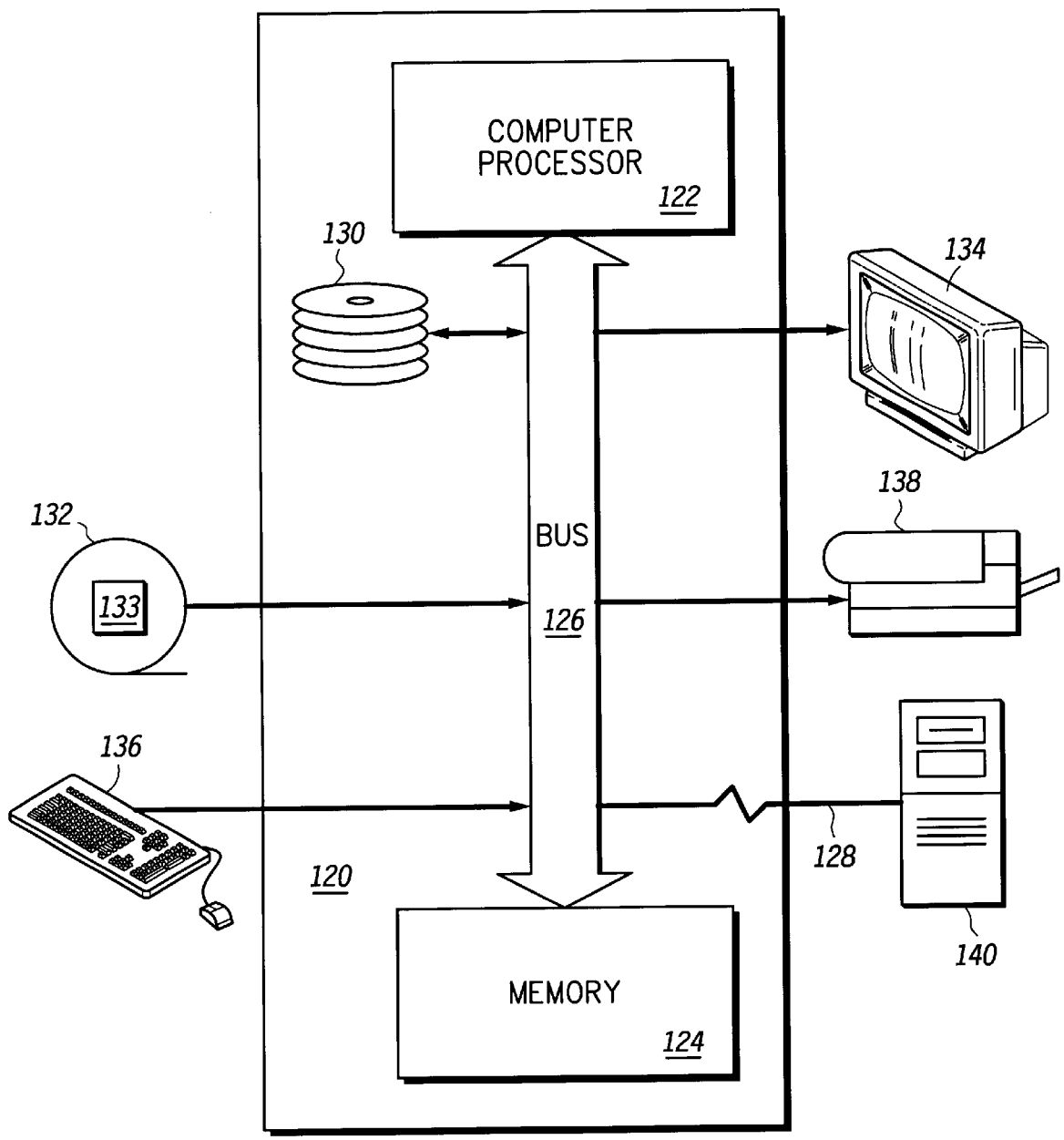
FIG. 9 illustrates in block diagram form a data processing system in accordance with one embodiment of the present invention.

FIG. 9 is a block diagram illustrating a General Purpose Computer 120 used to implement one embodiment of the present invention. General Purpose Computer 120 includes a Computer Processor 122 and Memory 124, connected by a Bus 126. Memory 124 is a relatively high speed machine-readable medium and includes Volatile Memories such as DRAM, and SRAM, and Non-Volatile Memories such as, ROM, FLASH, EPROM,EEPROM, and bubble memory. Also connected to the Bus are Secondary Storage 130, External Storage 132, output devices such as monitor 134, input devices such as keyboard (with mouse) 136, and printers 138. Secondary Storage 130 includes machine-readable media such as hard disk drives, magnetic drum, and bubble memory. External Storage 132 includes machine-readable media such as floppy disks, removable hard drives, magnetic tape, CD-ROM, and even other computers, possibly connected via a communications line. The distinction drawn here between Secondary Storage 30 and External Storage 132 is primarily for convenience in describing the invention. As such, it should be appreciated that there is substantial functional overlap between these elements. Computer software 133 including user programs can be stored in a Computer Software Storage Medium, such as memory 124, Secondary Storage 130, and External Storage 132. Secondary Storage 130 and Non-Volatile Memory are loaded for execution directly into Volatile Secondary Storage 130 prior to loading into Volatile Memory for execution.

The present invention provides a method and apparatus for preserving phase information during PWM quantization in power system applications.

While the present invention has been illustrated in digital audio amplification applications, it is also applicable to other power applications, including motor control, data conversion, power amplification, and radio frequency (RF) synthesizers with or without amplification. In any system where the output signal is quantized and noise is to be removed from the output, the present invention provides a method of noise shaping, where the quantization error is used in coordination with a noise shaping filter to remove the noise from the desired baseband of the output.

While the present invention has been described with respect to a few specific noise shaping filter configurations, any number of filters may be used, where an additional expression is added to the interim results to preserve the phase information. The expression may be a non-linear term, such as an integration term, and may include any number of individual integration terms, and may include a combination of integration terms. For example, in one embodiment of the present invention, integrators of the noise shaping filter are provided in a feed-forward series, where the output of each integrator is fed back to its input. In one embodiment, cross terms are used in the non-linear expression to preserve the phase. Similarly, the integrators may not all be coupled in a consistent manner, where only specific terms are used in the expression.

The present invention may be implemented in software, such as code stored in a computer readable medium. In one embodiment, the software is DSP code, and may be firmware within the DSP. In an alternate embodiment, a hardware accelerator is used to implement the noise shaping function. This may include a custom logic board with processor, and may implement at least a portion of the function in software. The entire filtering operation may also be implemented in an integrated circuit providing an embedded solution.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The present invention provides a method of noise shaping which is applicable in power distribution systems. The noise shaping capability of the present invention exceeds present industry performance in digital audio amplifiers, including Dolby with digital volume control. It is particularly applicable for integrated solutions and is suitable for embedded custom logic solutions. The present invention may be implemented in software or may be a hardware solution provided within an integrated digital signal processing (DSP) system. Noise shaping is applied to a PWM quantized signal, rather than a PCM signal. The present invention is able to achieve an SNR corresponding to a two-sided PWM.

The present invention provides a non-linear approximation of the error term which is used for noise shaping and which reduces the noise band of the received signal. The present invention also increases the SNR of a signal making it easier to separate the noise from the desired signal.

What is claimed is:

1. A method for converting a digital signal to a lower resolution digital signal comprising:
   receiving the digital signal; and
   computing the lower resolution digital signal by noise shaping using at least one non-linear term, wherein computing the lower resolution digital signal comprises noise shaping a difference between the digital signal and the lower resolution digital signal using the at least one non-linear term.

2. The method of claim 1, wherein the noise shaping is performed by an integrating noise shaper.

3. The method of claim 2, wherein the integrating noise shaper is a cascaded integrating noise shaper.

4. The method of claim 3, wherein the integrating noise shaper is a second order integrating noise shaper.

5. The method of claim 3, wherein the cascaded integrating noise shaper comprising a first integrator and a second integrator, wherein the second integrator receives the at least one non-linear term and an output of the first integrator.

6. The method of claim 5, wherein the at least one non-linear term is a non-linear approximation of a continuous time integration based on the digital signal and the lower resolution digital signal.

7. The method of claim 3, wherein the cascaded integrating noise shaper is an Nth order cascaded integrating noise shaper comprising N integrators, wherein each of the N integrators has a corresponding integrator output.

8. The method of claim 7, wherein the N integrators comprise N-1 higher order integrators and each higher order integrator receives a corresponding non-linear term.

9. The method of claim 7, wherein at least one of the N integrators receives an output from at least one previous integrator.

10. The method of claim 7, wherein at least one of the N integrators receives an output from at least one subsequent integrator.

11. The method of claim 7, wherein each of the N integrators receives the digital signal.

12. The method of claim 1, wherein the digital signal is a naturally sampled digital signal.

13. The method of claim 1, wherein the digital signal is a two-sided pulse width modulation (PWM) signal and the lower resolution digital signal is a lower resolution two-sided PWM signal.

14. The method of claim 1, wherein the lower resolution digital signal is a quantized PWM signal.

15. The method of claim 1, wherein the at least one non-linear term preserves phase information.

16. A computer readable medium comprising the method of claim 1.

17. A storage circuit for storing a plurality of binary values, wherein the plurality of binary values are used to control execution of the method of claim 1.

18. A hardware accelerator comprising a multiplier, control circuitry, and storage circuitry, wherein the hardware accelerator is used to execute the method of claim 1.

19. A digital signal processor comprising the hardware accelerator of claim 18.

20. Circuitry for converting a digital signal to a lower resolution digital signal, comprising:
a noise shaping quantizer, said noise shaping quantizer having a first input to receive the digital signal, having an output to provide the lower resolution digital signal, and having a second input to receive a non-linear term, wherein the noise shaping quantizer further comprises a noise shaper having a first input to receive the non-linear term, a second input for receiving a feedback term, and an output for providing a shaped error term, wherein the feedback term is a difference between the digital signal and the lower resolution digital signal.

21. The circuitry of claim 20, wherein the noise shaping quantizer further comprises:
a quantizer having an input to receive a sum of the shaped error term and the digital signal, and an output for providing the lower resolution digital signal.

22. The circuitry of claim 20, wherein the noise shaper is a cascaded integrating noise shaper.

23. The circuitry of claim 22, wherein the cascaded integrating noise shaper is an Nth order integrator and further comprises:
N integrators, wherein each integrator provides an integrator output and each higher order integrator has a first input for receiving a corresponding non-linear term; and
a summing node coupled to provide a weighted sum of the integrator outputs.

24. The circuitry of claim 23, wherein the corresponding non-linear terms are based on the digital signal and the lower resolution digital signal.

25. The circuitry of claim 23, wherein at least one higher order integrator has an input for receiving the output of a subsequent integrator.

26. The circuitry of claim 23, wherein N is chosen such that an improved in-band signal to noise ratio is achieved.

27. The circuitry of claim 20, wherein the non-linear term preserves phase information.

28. A method for converting a digital signal to a lower resolution digital signal comprising:
receiving the digital signal; and
computing the lower resolution digital signal by noise shaping using at least one non-linear term, wherein the noise shaping is performed by a cascaded integrating noise shaper, comprising:
a first integrator and a second integrator, wherein the second integrator receives the at least one non-linear term and an output of the first integrator.

29. The method of claim 28, wherein the cascaded integrating noise shaper is a second order integrating noise shaper.

30. The method of claim 28, wherein the at least one non-linear term is a non-linear approximation of a continuous time integration based on the digital signal and the lower resolution digital signal.

31. The method of claim 28, wherein the cascaded integrating noise shaper is an Nth order cascaded integrating noise shaper comprising N integrators, wherein each of the N integrators has a corresponding integrator output.

32. The method of claim 31, wherein computing the lower resolution digital signal comprises calculating a weighted summation of the corresponding integrator outputs.

33. The method of claim 31, further comprising:
calculating a first weighted output of a last integrator of the N integrators; and
providing the first weighted output to a first previous integrator.

34. The method of claim 33, further comprising:
calculating a second weighted output of the last integrator of the N integrators; and
providing the second weighted output to a second previous integrator.

35. The method of claim 31, wherein N is chosen such that an improved signal to noise ratio is achieved for a predetermined frequency range.

36. The method of claim 31, wherein the N integrators comprise N-1 higher order integrators and a plurality of higher order integrators receives a corresponding non-linear term.

37. The method of claim 36, wherein each of the N-1 higher order integrators receives a corresponding non-linear term.

38. The method of claim 36, wherein each of the corresponding non-linear terms preserves phase information.

39. The method of claim 38, wherein each of the corresponding non-linear terms correspond to a level of integration.

40. The method of claim 39, wherein each of the corresponding non-linear terms represents a non-linear approximation of a continuous time integration based on the digital signal and the lower resolution digital signal.

41. The method of claim 39, wherein the corresponding non-linear term of a higher order integrator includes at least a portion of the corresponding non-linear term of a previous higher order integrator.

42. The method of claim 39, wherein each of the corresponding non-linear terms is based at least in part on the order of the noise shaper.

43. The method of claim 31, wherein the N integrators comprise N-1 higher order integrators and each higher order integrator receives a corresponding non-linear term.

44. The method of claim 31, wherein at least one of the N integrators receives an output from at least one previous integrator.

45. The method of claim 31, wherein at least one of the N integrators receives an output from at least one subsequent integrator.

46. The method of claim 31, wherein each of the N integrators receives the a digital signal.

47. The method of claim 28, wherein the at least one non-linear term preserves phase information.

48. A computer readable medium comprising the method of claim 28.

49. A storage circuit for storing a plurality of binary values, wherein the plurality of binary values are used to control execution of the method of claim 28.

50. A hardware accelerator comprising a multiplier, control circuitry, and storage circuitry, wherein the hardware accelerator is used to execute the method of claim 28.

51. A digital signal processor comprising the hardware accelerator of claim 50.

* * * * *